(12) United States Patent
Sawai

(10) Patent No.: US 6,177,724 B1
(45) Date of Patent: Jan. 23, 2001

(54) SEMICONDUCTOR DEVICE

(75) Inventor: Akiyoshi Sawai, Hyogo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/397,770

(22) Filed: Sep. 16, 1999

(30) Foreign Application Priority Data

May 13, 1999  (JP) .................................................. 11-132474

(51) Int. Cl.$^7$ .................................................. H01L 23/12
(52) U.S. Cl. .................... 257/701; 257/730; 257/737; 257/778; 257/787
(58) Field of Search .................... 257/701, 730, 257/737, 738, 778, 787

(56) References Cited

U.S. PATENT DOCUMENTS 5,475,259 * 12/1995 Kasai et al. ........................ 257/730
5,708,300 * 1/1998 Woosley et al. ................... 257/730
5,841,192 * 11/1998 Exposito ............................ 257/778

FOREIGN PATENT DOCUMENTS

| 8-139228 | 5/1996 | (JP) . |
| 9-22961 | 1/1997 | (JP) . |
| 9-330994 | 12/1997 | (JP) . |

* cited by examiner

*Primary Examiner*—Roy Potter
(74) *Attorney, Agent, or Firm*—McDermott, Will & Emery

(57) ABSTRACT

A semiconductor package has a first region having a thickness equivalent to or slightly larger than a semiconductor chip 4 (0.35 to 0.7 mm) and sealed with resin, and a second region provided on the outside of the first region, having a thickness smaller than that of the first region (0.15 mm to 0.35 mm), and sealed with resin. A semiconductor having a mold package structure capable of preventing the package from warpage can be provided according to this structure.

10 Claims, 6 Drawing Sheets

SEMICONDUCTOR DEVICE

BACKGROUND OF THE INVENTION

1. Field of the Invention

The present invention relates to a semiconductor device having a mold package structure (ball giid array package or land grid array package) obtained by sealing a semiconductor chip loaded on a frame of an organic material such as glass epoxy resin with resin by transfer molding.

2. Description of the Prior Art

In a semiconductor device having a mold package structure (BGA or LGA) employing a frame of an organic material such as glass epoxy resin, a semiconductor chip loaded on the frame is sealed with resin by transfer molding.

The frame is previously formed with pads connected with the semiconductor chip through inner bumps or by flip chip bonding, pads forming external connection electrodes and wiring patterns coupling the pads with each other.

FIGS. 11 and 12 show structures of semiconductor chips loaded on frames respectively. FIG. 11 shows a flip chip bonding structure obtained by directing the active surface of a semiconductor chip 4 downward (face down bonding) to wiring patterns 6 provided on the surface of a frame 2 and electrically connecting pad electrodes (not shown) of the semiconductor chip 4 with the wiring patterns 6 through inner bumps 5. The semiconductor chip 4 and the inner bumps 5 are sealed with a package 1.

FIG. 12 shows a wire bonding structure obtained by directing the active surface of a semiconductor chip 4 upward (face up bonding) to wiring patterns 6 provided on the surface of a frame 2 and fixing the semiconductor chip 4 to the frame 2 with a die bonding material 8 while electrically connecting pad electrodes (not shown) of the semiconductor chip 4 with the wiring patterns 6 through metal thin wires 7. The semiconductor chip 4 and the metal thin wires 7 are sealed with resin 1. After the semiconductor chip 4 is sealed with resin, external connection electrodes are formed on the rear surface of the frame 2 in each of the flip chip bonding structure and the wire bonding structure. The external connection electrodes may be formed by wires of the frame 2 themselves, or balls consisting of solder or the like. After formation of the external connection electrodes, the frame 2 is divided into a fragment with a mold or a laser beam, thereby completing a semiconductor device sealed with resin.

In the conventional semiconductor device having the aforementioned mold package structure, the overall loaded surface of the chip 4 is sealed with resin by transfer molding in an area equivalent to that of the frame 2.

If the ratio of the area occupied by the semiconductor chip 4 to the total area of the frame 2 is small, however, the package is considerably warped as shown in FIG. 13 or 14. Thus, the package is restricted in size with respect to the semiconductor chip 4.

Particularly when the package is at least 15 mm square in size and has at least 250 external connection electrode pins, warpage of the package may exceed 0.1 mm depending on the chip size, to result in the following problems:

Warpage of the package directly correlates with the flatness of the external connection electrodes. If the package is remarkably warped, the external connection electrodes of the semiconductor device are not connected with wires of a printed board.

The resin employed for transfer molding remarkably hardens/shrinks as the thickness thereof increases. If the resin sealing the semiconductor device has a large thickness, therefore, the package is inevitably remarkably warped.

Also when the loaded surface of the semiconductor chip is not entirely sealed with resin in an area equivalent to that of the frame but only a chip area is sealed with resin, the flatness of the external connection electrodes is deteriorated due to warpage of the mold package.

This defect tends to occur when the employed frame is extremely thin (about 0.1 mm), conceivably because of winding or warpage of the frame partially exposed on the outside of the semiconductor chip area. In the structure of this mold package, the strength of the package itself is extremely reduced, to conceivably result in inconvenience when the package is mounted on a printed board or the like.

SUMMARY OF THE INVENTION

An object of the present invention is to provide a semiconductor device comprising a package sealing a semiconductor chip loaded on the surface of a flat frame consisting of an organic material such as glass epoxy resin with resin by transfer molding and an external connection electrode provided on the rear surface of the frame, having a structure capable of preventing the package from warpage.

The semiconductor device according to the present invention has a package sealing a semiconductor chip loaded on the surface of a flat frame consisting of an organic material such as glass epoxy resin with resin by transfer molding and an external connection electrode provided on the rear surface of the frame. The package includes a first region where a chip area equivalent to or slightly larger than the semiconductor chip is sealed with resin and a second region sealed with resin on the outside of the first region in a thickness smaller than that of the first region.

According to the aforementioned structure, warpage of the package can be reduced as compared with the case of thickly sealing the overall frame with resin. This is because the amount of resin is reduced in the second region on the outside of the semiconductor chip area and hence warpage of the package resulting from hardening/shrinkage of the resin in this portion can be reduced. In the first region, the overall loaded surface of the semiconductor chip is sealed with resin, whereby the strength of the package is ensured by the strength of the resin.

In order to implement the present invention in a more preferred state, the following structure is employed:

Preferably, the semiconductor device has mold ribs radially extending from the four corners of the first region toward those of the package on an upper surface part of the second region. Preferably, the semiconductor device has a mold ring on the upper surface part of the package, to enclose the outer peripheral portion thereof.

When the mold ribs or the mold ring is provided on the upper surface part of the second region, warpage of the package can be reduced without thickly sealing the overall frame. Further, the mold ribs or the mold ring ensures the strength of the package.

Preferably, the semiconductor device has internal draw parts on the four corners of the first region. Preferably, the internal draw parts have at least two types of sectional shapes or sectional dimensions. Preferably, the semiconductor device has an external draw part on at least one of regions of the mold ribs located on the four corners of the package. Preferably, the sectional shapes or sectional dimensions of the internal draw parts are smaller than that of the external draw part. Preferably, the semiconductor device has at least one portion of rib draw part on the mold ribs. Preferably, the semiconductor device has at least one portion of ring draw part on the mold ring.

According to this structure, the resin draw parts can supply proper heat to flowing resin, while unnecessary portions can be readily broken along the draw parts when removed after hardening of the resin.

The sectional shapes or sectional dimensions of the internal draw parts are rendered smaller than that of the external draw part, thereby suppressing heat reception of the sealing resin before reaching the first region and enabling injection of completely melted resin having low viscosity into the first region.

Consequently, damage on the internal structural parts such as the semiconductor chip and gold wires can be reduced when injecting resin into the first region, which is the semiconductor chip area.

The internal draw parts have at least two types of sectional dimensions since part of resin passing through the internal draw part having the largest sectional dimension dominantly flows into the first region, so that the resin can be prevented from turbulence in the first region. Consequently, damage on the internal structural parts resulting from turbulence of resin in the first region can be reduced.

Preferably, the thickness of resin sealing the rear surface of the first region is smaller than that of the external connection electrode.

According to this structure, stress applied to the semiconductor chip due to hardening/shrinkage or heat shrinkage of the sealing resin can be reduced. This is because hardening/shrinkage or heat shrinkage of the sealing resin takes place on the loaded surface of the chip and the rear surface thereof independently of each other and hence stress applied to the chip can be canceled to some extent.

Preferably, slits are provided on regions of the frame including four corners on the outside of the region receiving the semiconductor chip.

In transfer molding, the frame is damped with a mold under high pressure, and hence the semiconductor chip and the frame are subjected to forced displacement due to the clamping even if the semiconductor chip and the frame are only slightly warped before molding.

The semiconductor chip may be cracked or flip chip bonding may be disconnected due to the forced displacement. Such inconvenience tends to take place on corner portions of the chip.

According to the present invention, the slits are formed on the four corners on the outside of the semiconductor chip area, whereby the corner portions of the semiconductor chip are freed in the clamped state, and not subjected to forced displacement. Thus, a semiconductor device having a mold package structure can be implemented with more reliable transfer molding.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Semiconductor devices having mold package structures according to embodiments of the present invention are now described with reference to the drawings.

First Embodiment

Figure 1:
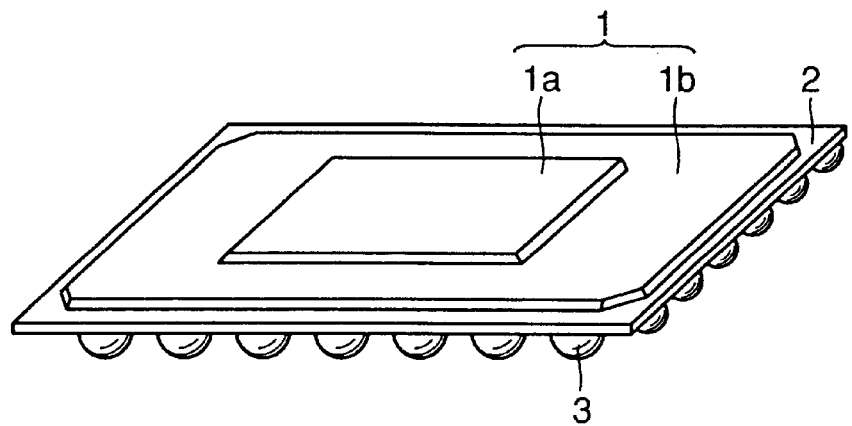
FIG. 1 is an overall perspective view of a semiconductor device having a mold package according to a first embodiment of the present invention.
Figure 2:
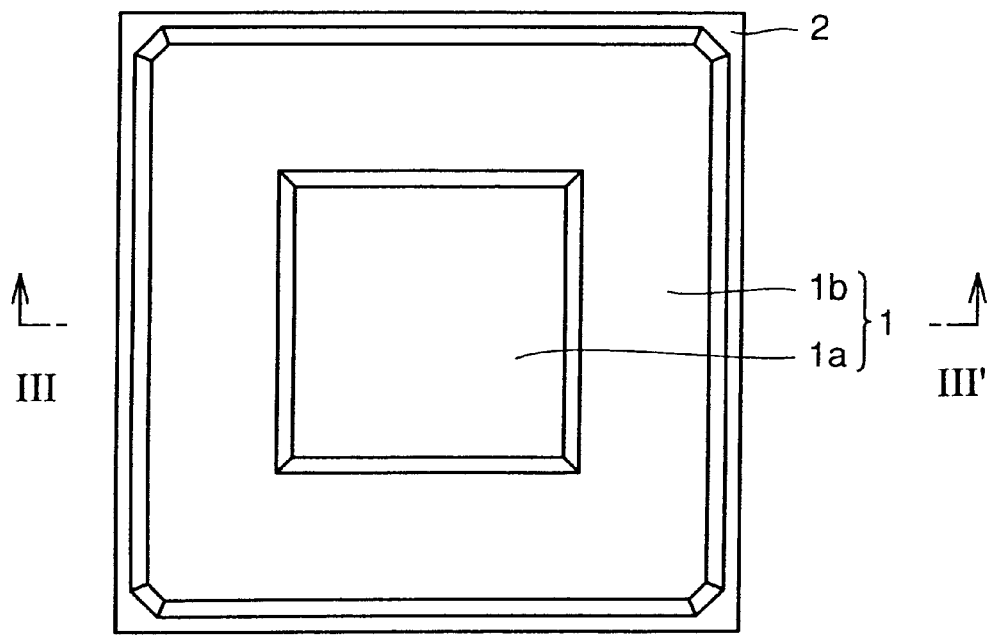
FIG. 2 is a plan view of the semiconductor device shown in FIG. 1.
Figure 3:
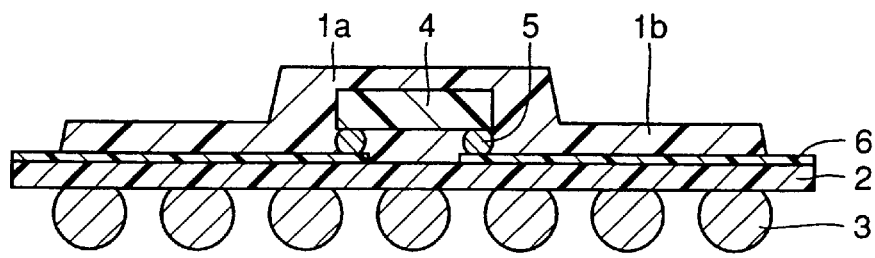
FIG. 3 is a sectional view taken along the line X–X' in FIG. 2.

A semiconductor device having a semiconductor mold package according to a first embodiment of the present invention is described with reference to FIGS. 1 to 3. FIG. 1 is an overall perspective view showing the semiconductor device having a semiconductor mold package according to the first embodiment, FIG. 2 is a plan view thereof, and FIG. 3 is a sectional view taken along the line III—III' in FIG. 2.

A semiconductor chip 4 is loaded on a flat frame 2 consisting of an organic material such as glass epoxy resin, so that wiring patterns 6 of the frame 2 are electrically connected with pad electrodes (not shown) of the semiconductor chip 4 through inner bumps 5. A package 1 is formed by clamping the frame 2 with a mold (not shown) and thereafter injecting molding resin by transfer molding. The mold is provided with engraved parts called runners defining passages for the resin and other engraved parts called cavities defining portions for sealing the package 1.

After the semiconductor chip 4 is sealed with resin, unnecessary portions (culls and the runners) consisting of the sealing resin are removed by breaking gates. Thereafter external electrodes (solder balls) consisting of solder are formed on the rear surface of the frame 2 opposite to that receiving the semiconductor chip 4. Unnecessary portions of the frame 2 and the package 1 are separated in a fragmentation step employing a cutting mold or the like.

According to this embodiment, only a first region 1a equivalent to or slightly larger than the semiconductor chip 4 is thickly (0.35 to 0.7 mm) sealed with resin while a second region 1b on the outside of the first region 1a is thinly (0.15 to 0.35 mm) sealed with resin in the package 1. The shape of the package 1 depends on those of the cavities of the mold.

According to this structure, warpage of the package 1 can be reduced as compared with the conventional structure thickly (0.35 to 0.7 mm) sealing the overall frame 2. This is because the amount of resin sealing the second region 1b is reduced and hence warpage of the package 1 resulting from hardening/shrinkage of the resin in this region 1b can be reduced. Further, the overall frame 2 is sealed with resin, for ensuring the strength of the package 1 with the strength of the resin.

Figure 4:
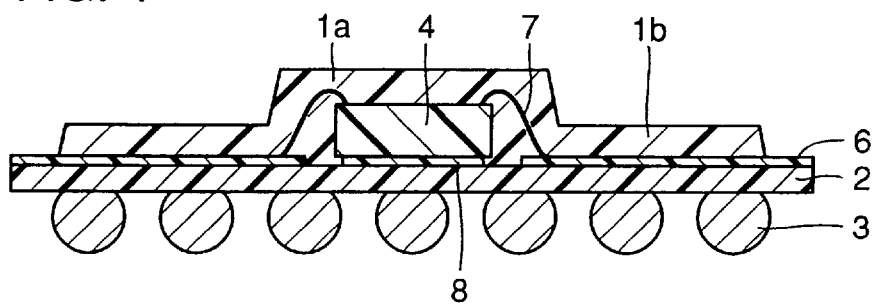
FIG. 4 is a sectional view showing another structure of the semiconductor device according to the first embodiment.

FIG. 4 is a sectional view showing a section, corresponding to that taken along the line III—III' in FIG. 2, of another structure of the semiconductor device according to the first embodiment employing a wire bonding structure.

Second Embodiment

Figure 5:
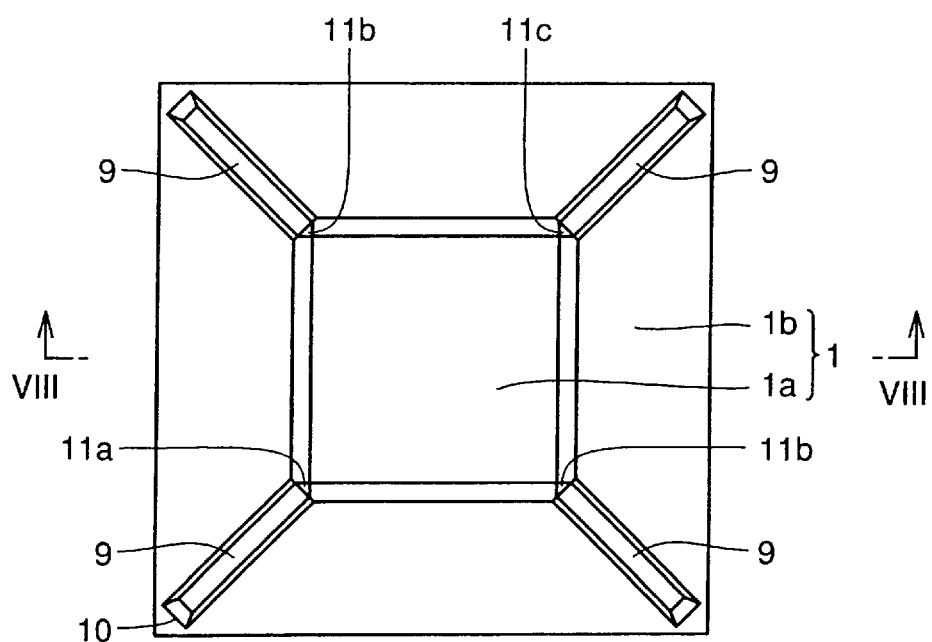
FIG. 5 is a plan view showing the structure of a semiconductor device according to a second or fourth embodiment of the present invention.

A semiconductor device having a semiconductor mold package 1 according to a second embodiment of the present invention is different from the semiconductor device having a semiconductor mold package according to the first embodiment in a point that the semiconductor device according to the second embodiment has mold ribs 9 radially extending from the four corners of a first region 1a toward those of the package 1 on an upper surface part of a second region 1b, as shown in a plan view of FIG. 5.

The shape of the mold ribs 9 depends on those of cavities of a mold. The thickness of the mold ribs 9 may not be identical to that of resin sealing the first region 1a. After a semiconductor chip is sealed with resin, unnecessary portions (culls and runners) consisting of the sealing resin are removed by breaking gates, while the mold ribs 9 are not removed but left on the second region 1b.

According to the aforementioned structure, warpage of the package 1 can be reduced as compared with the structure according to the first embodiment. The strength of the package 1 is ensured by that of the resin of the mold ribs 9.

Third Embodiment

Figure 6:
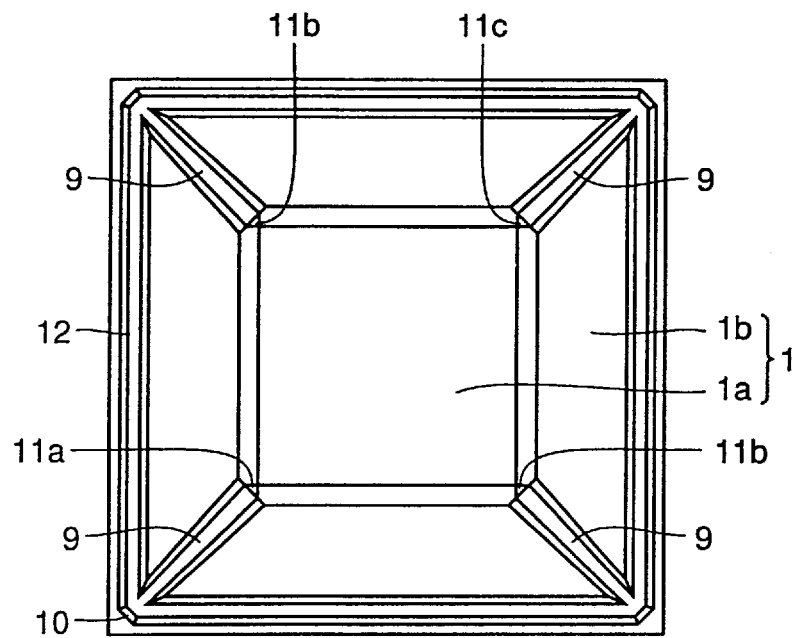
FIG. 6 is a plan view showing the structure of a semiconductor device according to a third or fourth embodiment of the present invention.

A semiconductor device having a semiconductor mold package 1 according to a third embodiment of the present invention is different from the semiconductor device having a semiconductor mold package according to the second embodiment in a point that the semiconductor device according to the third embodiment has a mold ring 12 provided on an upper surface part of the package 1 to enclose the outer peripheral portion thereof, as shown in a plan view of FIG. 6. The shape of the mold ring 12 depends on those of cavities of a mold.

The thickness of the mold ring 12 may not be identical to that of resin sealing a first region 1a, similarly to the mold ribs 9. After a semiconductor chip is sealed with resin, unnecessary portions (culls and runners) of sealing resin are removed by breaking gates, while the mold ring 12 is not removed but left on the package 1.

Also according to this structure, function/effect similar to that of the second embodiment can be attained.

Fourth Embodiment

According to a fourth embodiment of the present invention, internal draw parts 11a, 11b and 1c are provided on the outside of the four corners of a first region 1a as shown in FIG. 5 or 6 in a structure similar to that of the second or third embodiment, with at least two types, three types in this embodiment, of sectional shapes or sectional dimensions.

Further, an external draw part 10 is provided on at least one of regions of the mold ribs 9 and/or the mold ring 12 located on the four corners of the package 1. The sectional shapes or sectional dimensions of the internal draw parts 11a, 11b and 11c are preferably smaller than that of the external draw part 10. The shapes of the internal draw parts 11a, 11b and 11c and the external draw part 10 depend on those of cavities of a mold.

The internal draw parts 11a, 11b and 11c and the external draw part 10 (hereinafter simply referred to as draw parts) are so provided as to supply proper heat to flowing resin and facilitate removal of unnecessary portions (culls and runners) after the resin hardens by readily breaking gates.

The sectional shapes or sectional dimensions of the internal draw parts 11a, 11b and 11c are rendered smaller than that of the external draw part 10 for reducing damage on internal structural parts such as the semiconductor chip, gold wires and the like when injecting resin into a first region 1a within the area of the semiconductor chip.

Molding resin, which is generally prepared from thermosetting resin such as epoxy resin, is heated to about 180° C. to flow in the mold in a melted state. If the heat reception time is too long, however, the viscosity of the resin is increased due to the characteristics of the thermosetting resin, to increase damage on the internal structural parts.

If the heat reception time is too short, the resin is incompletely melted to increase damage on the internal structural parts. In general, the heat reception effect of the resin is increased as the draw parts are reduced in size. It is assumed that the proper injection time for the resin is about 10 seconds.

Heat reception of the resin before reaching the first region 1a can be suppressed by enlarging the sectional shape or sectional dimension of the external draw part 10, while completely melted resin having low viscosity can be injected into the first region 1a by reducing the internal draw parts 11a, 11b and 11c.

The internal draw parts 11a, 11b and 11c have at least two types of sectional shapes or sectional dimensions, in order to reduce damage on the internal structural parts resulting from turbulence of the resin in the first region 1a.

Resin readily flows as the width of a passage therefor is increased, and the mold ribs 9 and the mold ring 12 having no obstacles tend to flow. Turbulence results from collision of forward ends of a resin stream passing through the internal draw part 11a and that passing through the internal draw parts 11b and 11c through the mold ring 12 in the first region 1a.

The internal draw part 11a located on the same corner as the external draw part 10 preferably has a gate size larger than those of the internal draw parts 11b and 11c. In this case, the resin stream passing through the internal draw part 11a dominantly flows into the first region 1a, so that the first region 1a can be prevented from turbulence.

Fifth Embodiment

Figure 7:
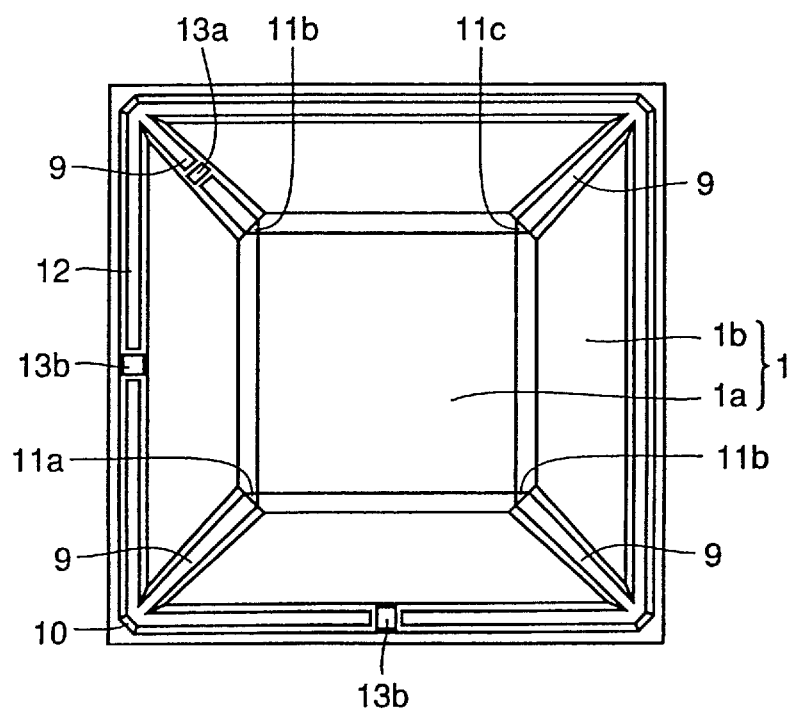
FIG. 7 is a plan view showing the structure of a semiconductor device according to a fifth embodiment of the present invention.

A fifth embodiment of the present invention is characterized in that at least one portion of rib draw part 13a or ring draw part 13b is provided on mold ribs 9 or a mold ring 12 in a structure similar to those of the second to fourth embodiments, as shown in FIG. 7. According to this structure, function/effect equivalent or superior to those of the second to fourth embodiments can be attained.

Sixth Embodiment

Figure 8:
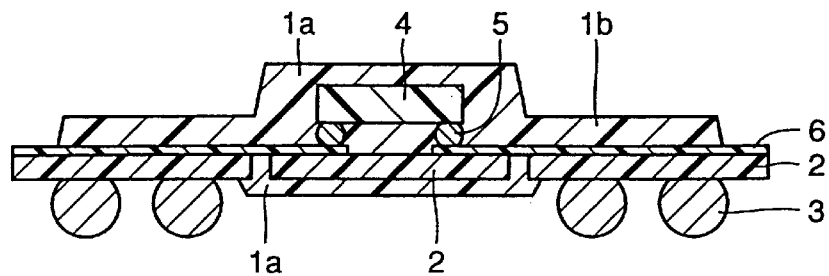
FIG. 8 is a sectional view showing the structure of a semiconductor device according to a sixth embodiment of the present invention.
Figure 9:
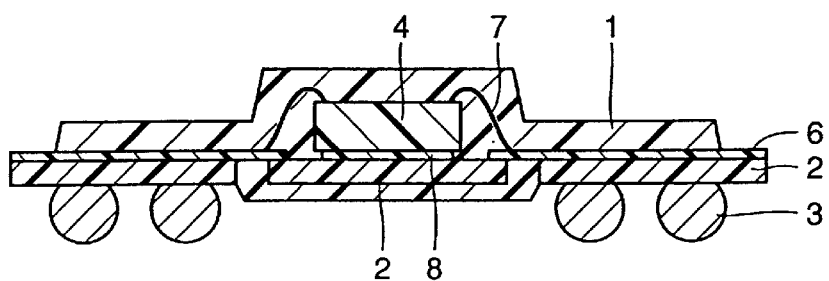
FIG. 9 is a sectional view showing another structure of the semiconductor device according to the sixth embodiment.

A sixth embodiment of the present invention is characterized in that the thickness of resin sealing the rear surface of a first region 1a is smaller than that of external connection electrodes 3 as shown in a sectional structure of FIG. 8 or 9 in a structure similar to any of those according to the first to fifth embodiments. FIG. 8 shows a flip chip bonding structure, and FIG. 9 shows a wire bonding structure.

Thus, a frame 2 is sealed with resin also on the rear surface of the first region 1a, thereby enabling reduction of stress applied to a semiconductor chip 4 due to hardening/shrinkage or heat shrinkage of resin resulting from molding. This is because hardening/shrinkage or heat shrinkage of resin takes place on the surface receiving the semiconductor chip 4 and the rear surface thereof independently of each other and hence stress applied to the semiconductor chip 4 can be canceled to some extent.

In general, the semiconductor chip 4 and the frame 2 receiving the same are slightly warped. If only the surface of the first region 1a is sealed with resin, the semiconductor chip 4 and the frame 2 are subjected to forced displacement due to injection pressure. This is because a mold section facing the rear surface of the first region 1a is flat. The semiconductor chip 4 may be cracked or flip chip bonding may be disconnected due to such forced displacement.

According to this embodiment, a mold section receiving the rear surface of the first region 1a is provided with cavities for injecting resin, and hence the semiconductor chip 4 and the frame 2 are not subjected to forced displacement by injection pressure. Consequently, the semiconductor chip 4 can be prevented from cracking and flip chip bonding can be prevented from disconnection.

Seventh Embodiment

Figure 10:
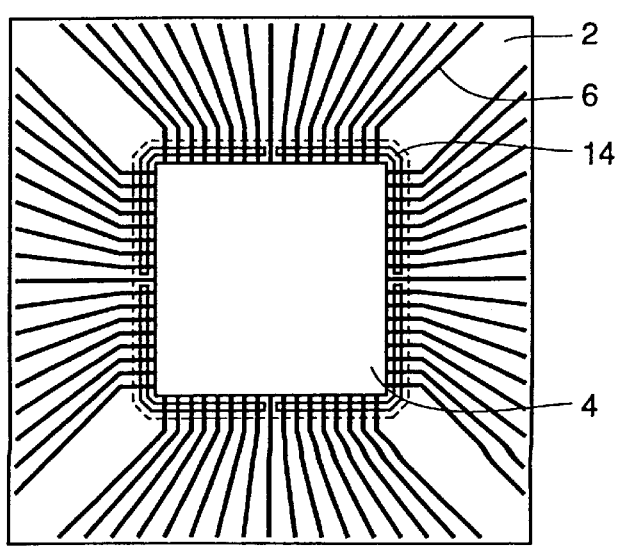
FIG. 10 is a plan view showing the structure of a semiconductor device according to a seventh embodiment of the present invention.
Figure 11:
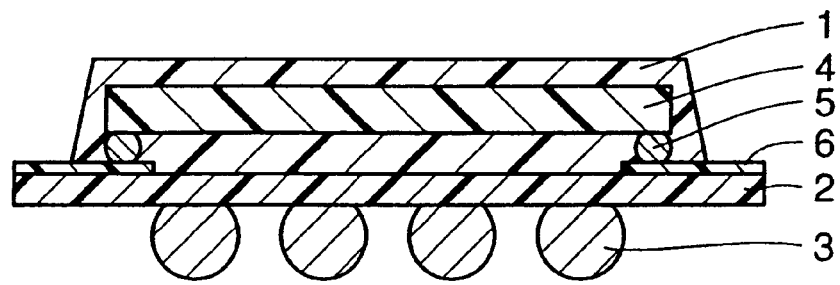
FIG. 11 is a first sectional view showing the structure of a semiconductor device having a semiconductor mold package structure according to prior art.
Figure 12:
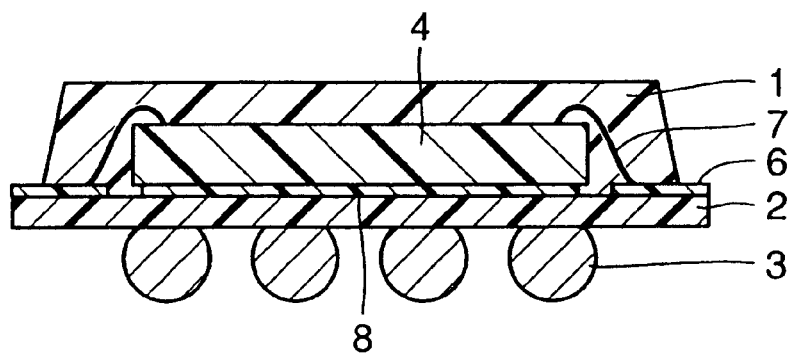
FIG. 12 is a second sectional view showing the structure of a semiconductor device having a semiconductor mold package structure according to prior art.
Figure 13:
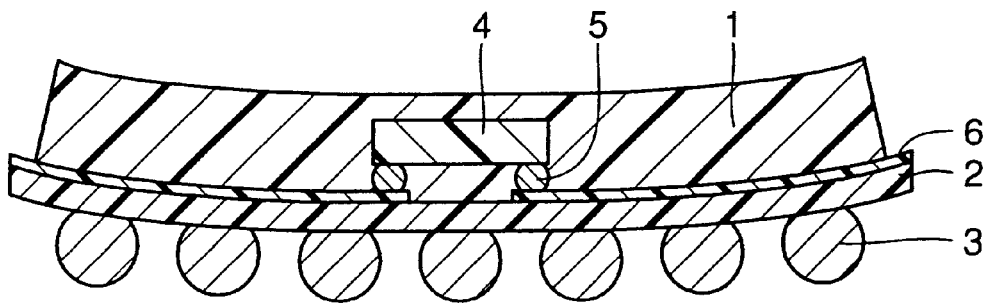
FIG. 13 is a first sectional view showing a problem of the semiconductor device having the semiconductor mold package structure according to the prior art.
Figure 14:
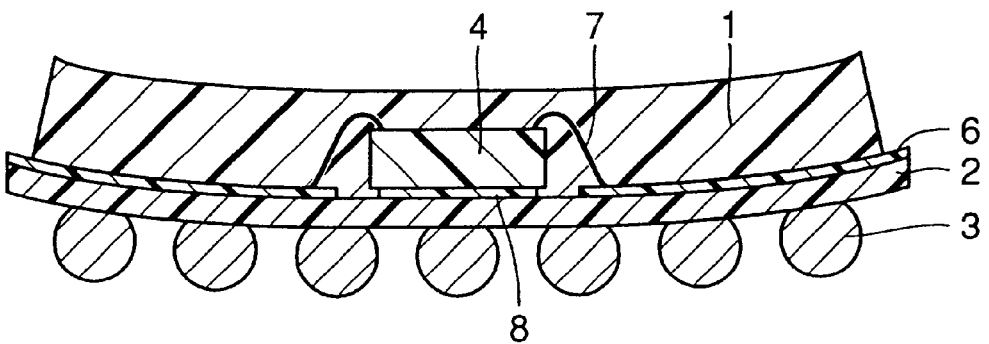
FIG. 14 is a second sectional view showing the problem of the semiconductor device having the semiconductor mold package structure according to the prior art.

A semiconductor device according to a seventh embodiment of the present invention has slits 14 on regions of a frame 2 including four corners on the outside of a first region 1a as shown in FIG. 10, in a structure similar to any of those according to the first to sixth embodiments. Wiring patterns may extend over the slits 14.

In general, the frame 2 is clamped with a mold under high pressure in transfer molding, and hence the semiconductor chip 4 and the frame 2 are subjected to forced displacement due to the clamping even if the semiconductor chip 4 and the frame 2 are only slightly warped before molding. The semiconductor chip 4 may be cracked or flip chip bonding may be disconnected due to the forced displacement. Such inconvenience tends to take place on corner portions of the semiconductor chip 4.

According to this embodiment, the slits 14 are formed on the regions including the four corners on the outside of the first region 1a, whereby the corner portions of the semiconductor chip 4 are freed in a clamped state, and not subjected to forced displacement. Thus, a more reliable transfer molding process can be implemented.

Further, the slits 14 serve as passages for resin from the chip receiving surface toward the rear surface. In this case, the slits 14 must be at least 0.15 mm in width. Thus, no specific resin passages may be formed on a mold section receiving the rear surface but the structure of a semiconductor mold package according to the seventh embodiment can be implemented with a simple mold structure.

According to the structure of the inventive semiconductor device, the amount of resin is reduced in the second region on the outside of the semiconductor chip area for enabling reduction of warpage of the package resulting from hardening/shrinkage of resin in this portion, whereby warpage of the package can be reduced as compared with the case of thickly sealing the overall frame with resin. Further, the second region is sealed with resin through the ribs and the ring along the overall frame, whereby the strength of the package is ensured by that of the resin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising a package sealing a semiconductor chip loaded on the surface of a flat frame consisting of an organic material such as glass epoxy resin with resin by transfer molding and an external connection electrode provided on a rear surface of said frame, wherein said package includes:
   a first region where a chip area equivalent to or slightly larger than said semiconductor chip is sealed within resin;
   a second region sealed with resin on the outside of said first region in a thickness smaller than the thickness of said first region; and
   mold ribs radially extending from the four corners of said first region toward the four corners of said package on an upper surface part of said second region.

2. The semiconductor device in accordance with claim 1, having a mold ring on an upper surface part of said package to enclose the outer peripheral portion of said package.

3. The semiconductor device in accordance with claim 2, having at least one portion of ring draw part on said mold ring.

4. The semiconductor device in accordance with claim 1, wherein internal draw parts are provided on the four corners of said first region.

5. The semiconductor device in accordance with claim 4, wherein said internal draw parts have at least two types of sectional shapes or sectional dimensions.

6. The semiconductor device in accordance with claim 1, having an external draw part on at least any of regions of said mold ribs located on the four corners of said package.

7. The semiconductor device in accordance with claim 6, wherein the sectional shapes or sectional dimensions of said internal draw parts are smaller than the sectional shape or sectional dimension of said external draw part.

8. The semiconductor device in accordance with claim 1, having at least one portion of rib draw part on said mold ribs.

9. The semiconductor device in accordance with claim 1, wherein the thickness of resin sealing the rear surface of said first region is smaller than the thickness of said external connection electrode.

10. A semiconductor device, comprising a package sealing a semiconductor chip loaded on the surface of a flat frame consisting of an organic material such as glass epoxy resin with resin by transfer molding and an external connection electrode provided on a rear surface of said frame, wherein said package includes:
    a first region where a chip area equivalent to or slightly larger than said semiconductor chip is sealed within resin; and
    a second region sealed with resin on the outside of said first region in a thickness smaller than the thickness of said first region,
    wherein slits are provided on regions including four corners on the outside of a region of said frame receiving said semiconductor chip.

* * * * *